United States Patent

Matsui et al.

[11] Patent Number: 4,679,200
[45] Date of Patent: Jul. 7, 1987

[54] SEMICONDUCTOR LASER

[75] Inventors: Sadayoshi Matsui, Tenri; Mototaka Taneya, Sakai; Haruhisa Takiguchi, Osaka; Shinji Kaneiwa, Tenri, all of Japan

[73] Assignee: Sharp Kabushiki Kaisha, Osaka, Japan

[21] Appl. No.: 691,917

[22] Filed: Jan. 16, 1985

[30] Foreign Application Priority Data

Jan. 17, 1984 [JP] Japan .................................. 59-6922

[51] Int. Cl.⁴ .............................................. H01S 3/19
[52] U.S. Cl. ...................................... 372/45; 372/46; 372/48
[58] Field of Search ...................... 372/45, 46, 48, 29; 357/17

[56] References Cited

U.S. PATENT DOCUMENTS 4,594,718 6/1986 Seifres et al. ........................ 372/48

FOREIGN PATENT DOCUMENTS 0197787 11/1983 Japan ..................................... 372/48
2128402 4/1984 United Kingdom .................. 372/45

Primary Examiner—James W. Davie
Attorney, Agent, or Firm—Birch, Stewart, Kolasch & Birch

[57] ABSTRACT

A semiconductor laser includes a current blocking layer formed on a substrate, a first cladding layer formed on the current blocking layer, an active layer formed on the first cladding layer, and a second cladding layer formed on the active layer. An indent is formed in the current blocking layer near the center of the laser element, and a V-shaped groove is formed in the current blocking layer across the indent. A gain guide structure is formed where the indent is formed, and an index guide structure is formed near the cleaved facet. A stable transverse mode laser emission is ensured without the influence of the return beam reflected from the disc surface, and the attendant mode competition noise is reduced.

4 Claims, 11 Drawing Figures

4,679,200

SEMICONDUCTOR LASER

BACKGROUND OF THE INVENTION

1. Field of the Invention

The present invention relates to a semiconductor laser structure which ensures stable operation of a semiconductor laser element.

2. Description of the Prior Art

A semiconductor laser having an index guide structure has widely been used as a light source in an optical information processing system such as an information recording/drawing disc system. In such a system, if a return beam reflected from the disc surface is again introduced into the semiconductor laser, the return beam creates an interference effect, thereby increasing noise components as shown in FIG. 1. Further, if the semiconductor laser of the above-mentioned type is disposed in a high temperature ambience while maintaining the laser output intensity constant, noise components extremely increase above a certain temperature as shown in FIG. 2.

In order to resolve these problems, several improvements have been proposed. In accordance with one improvement, a current injection width, namely a stripe width, is narrowed to about the length of the carrier diffusion in an active layer, that is, about 2 to 4 $\mu$m so as to minimize the return beam noise and the mode competition noise. In such a semiconductor laser, the laser beam distribution is determined by the gain distribution. Since the cavity volume is small, the spontaneous emission beam greatly influences on the laser mode. Further, the gain spectrum width is widened due to the high density current injection, and the laser emission is performed in the multi longitudinal mode, whereby the influence caused by the return beam and the mode competition effect caused by the temperature rise are minimized. However, in the semiconductor laser having the gain guide structure, the near-field pattern changes due to the variation of the injection current, secular change, or due to the return beam. Therefore, a stable coupling with an optical system is not ensured. Further, the astigmatism is considerably large and, therefore, a good coupling is not ensured with an optical system, especially with a lens system.

OBJECTS AND SUMMARY OF THE INVENTION

Objects of the Invention

Accordingly, an object of the present invention is to provide a semiconductor laser which minimizes an interference noise caused by a return beam.

Another object of the present invention is to provide a semiconductor laser which minimizes a mode competition noise even at a considerably high temperature.

Still another object of the present invention is to provide a semiconductor laser which ensures a stable transverse mode.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, an index guide structure is formed near both cleaved facets of a laser oscillation cavity. That is, the index guide width is substantially equal to the current injection width near both ends of a semiconductor laser element. A gain guide structure is formed at the center of the semiconductor laser element. That is, the index guide width is considerably wider than the current injection width near the center of the cavity.

With this structure, the semiconductor laser of the present invention emits a laser beam in the multiple longitudinal mode. The index guide structure formed at both ends of the element functions to minimize the return beam noise and the mode competition noise. Further, the near-field pattern is stable, and the astigmatism is small.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
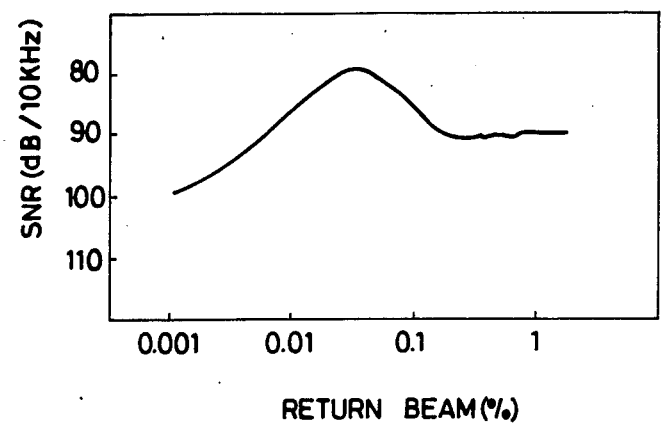
FIG. 1 is a graph showing a return beam noise characteristic in a conventional index guided semiconductor laser.
Figure 2:
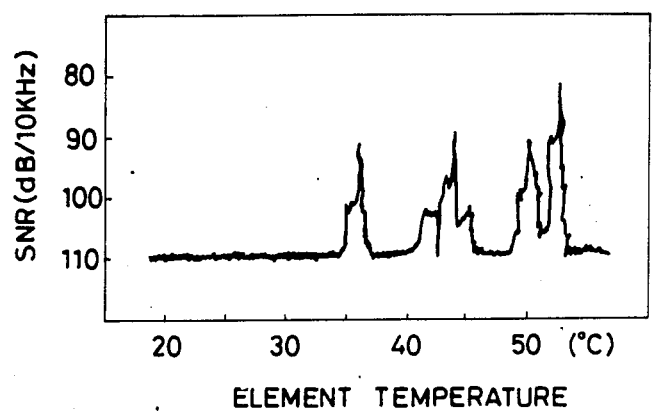
FIG. 2 is a graph showing a mode competition noise characteristic in a conventional index guided semiconductor laser.
Figure 3:
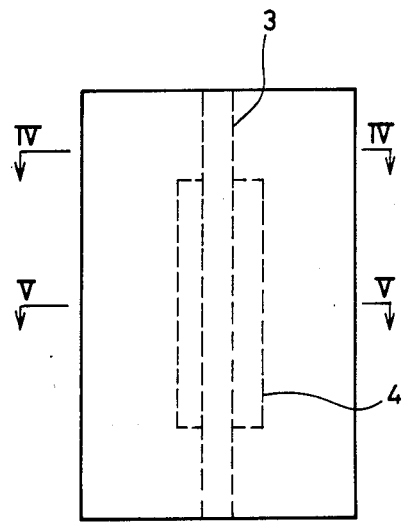
FIG. 3 is a plan view of an embodiment of a semiconductor laser of the present invention.
Figure 4:
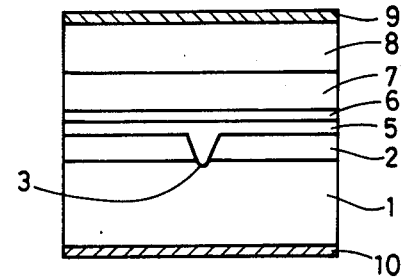
FIG. 4 is a sectional view taken along line IV—IV of FIG. 3.
Figure 5:
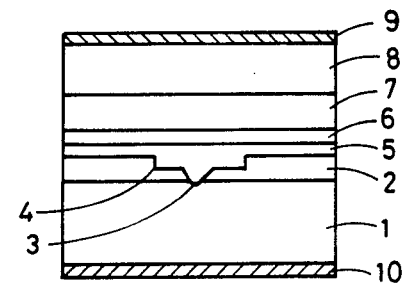
FIG. 5 is a sectional view taken along line V—V of FIG. 3.

FIGS. 3, 4 and 5 show an embodiment of a semiconductor laser of the present invention. A semiconductor laser of the present invention includes a p-GaAs substrate 1, and a current blocking layer 2 formed on the p-GaAs substrate 1. The current blocking layer 2 is made of an n-GaAs layer having a thickness of 0.6 to 1.5 $\mu$m. A V-shaped groove 3 is formed in the current blocking layer 2 to reach the p-GaAs substrate 1. An indent 4 having a width wider than the V-shaped groove 3 is formed near the center of the semiconductor laser before forming the V-shaped groove 3 in the current blocking layer 2. The indent 4 has a depth of about 0.1 to 0.2 μm so that the indent 4 does not reach the p-GaAs substrate 1, and the n-GaAs current blocking layer 2 has a thickness greater than 0.5 μm where the indent 4 is formed in the n-GaAs current blocking layer 2. The V-shaped groove 3 is formed in the n-GaAs current blocking layer 2 along the center line of the indent 4.

A p-GaAlAs cladding layer 5, an n-GaAlAs active layer (p-GaAlAs active layer)6, an n-GaAlAs cladding layer 7, and an n-GaAs contacting layer 8 are sequentially formed on the n-GaAs current blocking layer 2 by the liquid phase epitaxial growth method so as to form the double heterojunction inner stripe semiconductor laser. The AlAs mole fraction of the cladding layers 5 and 7 is selected higher than that of the active layer 6 by 0.2 to 0.6. A Au-Ge-Ni ohmic n-side electrode 9 is formed on the n-GaAs contacting layer 8. A Au-Zn ohmic p-side electrode 10 is formed at the back of the p-GaAs substrate 1. The Fabry-Perot cavity is cleaved so that the indent 4 is located at the center of the semiconductor laser. When current is injected through the n-electrode 9 and the p-electrode 10, the current flows through the current path determined by the V-shaped groove 3, and laser emission is carried out in the active layer 6 corresponding to the current path.

Figure 6:
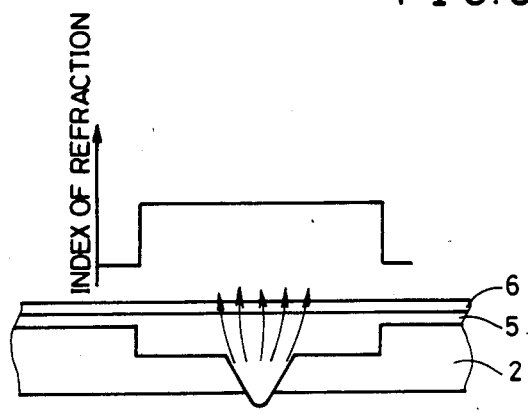
FIG. 6 is a schematic view for explaining current injection operation near the center of the semiconductor laser of FIG. 3.

FIG. 6 shows the current injection operation carried out near the center of the semiconductor laser of FIG. 3. Since the indent 4 having a width wider than the current injecting groove is formed in the current blocking layer 2, the index guide structure becomes considerably wider than the current injecting width. That is, the gain guide structure is formed near the center of the semiconductor laser. Therefore, the laser beam emission is carried out in the multiple longitudinal mode.

Figure 7:
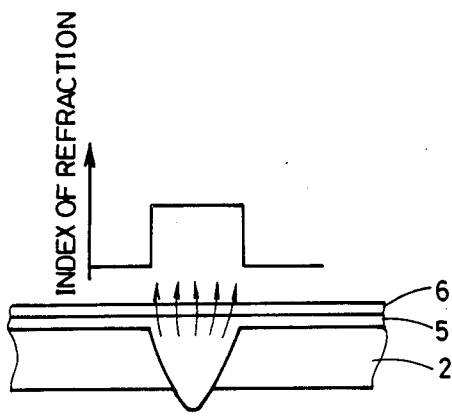
FIG. 7 is a schematic view for explaining current injection operation near cleaved facets of the semiconductor laser of FIG. 3.

FIG. 7 shows the current injection condition near the cleaved facet of the semiconductor laser of FIG. 3. As in the normal index guided semiconductor laser, the current injection width is identical with the wave guide width. The laser beam is guided along the wave guide and, therefore, the beam waist coincides the laser facet. The astigmatism is less than 5 μm, and the near-field pattern is stabilized.

Figure 8:
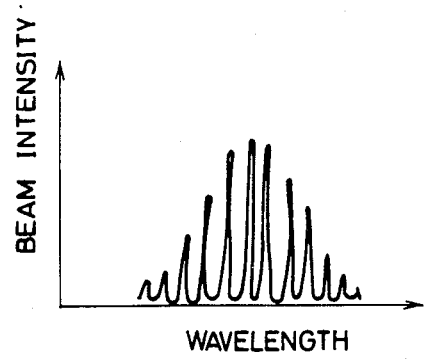
FIG. 8 is a graph showing an emission spectrum of the semiconductor laser of FIG. 3.
Figure 9:
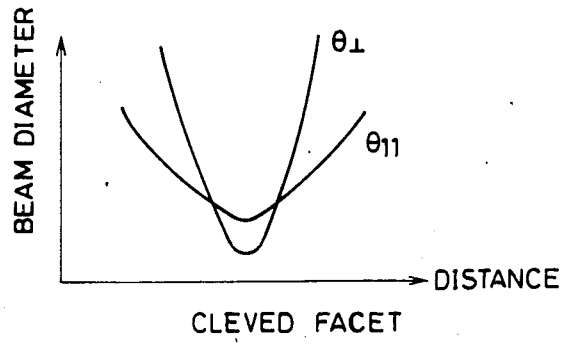
FIG. 9 is a graph showing a beam diameter of the laser beam emitted from the semiconductor laser of FIG. 3.
Figure 10:
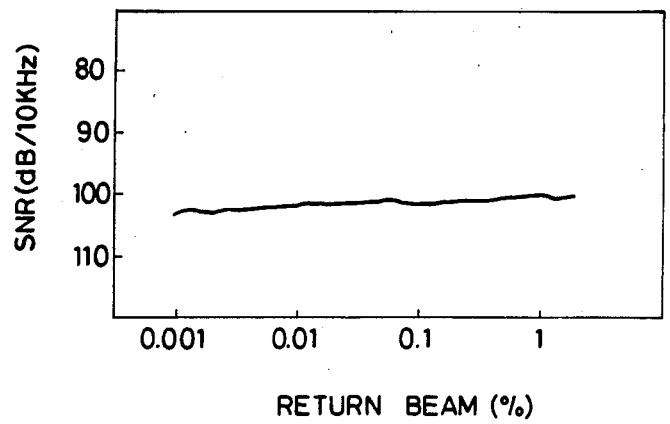
FIG. 10 is a graph showing a return beam noise characteristic in the semiconductor laser of FIG. 3.
Figure 11:
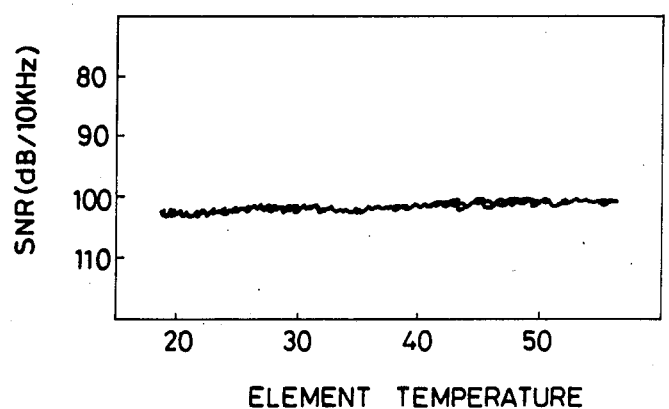
FIG. 11 is a graph showing a mode competition noise characteristic in the semiconductor laser of FIG. 3.

FIG. 8 shows an emission spectrum of the semiconductor laser of FIG. 3 at the output of 3 mW. FIG. 9 shows the beam waist position in the directions perpendicular to the PN junction and parallel with the PN junction. FIG. 10 shows the noise characteristic of the semiconductor laser of FIG. 3 depending on the return beam reflected from the disc surface when the laser emission is conducted at 3 mW output. FIG. 11 shows the relationship between the occurrence of the mode competition noise and the laser element temperature in the semiconductor laser of FIG. 3. It will be clear from FIG. 10 that the return beam noise is not generated because the laser emission is carried out in the multiple longitudinal mode. Further, the mode competition noise does not occur even at a high temperature as shown in FIG. 11. The near-field pattern is stable because of the index guide structure formed near both of the cleaved facets of the semiconductor laser. The astigmatism is less than 5 μm, and the semiconductor laser of the present invention ensures a good matching with an optical system.

The present invention is not limited to the GaAs-GaAlAs semiconductor laser. The present invention is applicable to semiconductor lasers of different materials. Further, the present invention is not limited to the inner stripe type, but the present invention is applicable to semiconductor lasers of the planar type.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor laser comprising:
   a substrate;
   a first electrode disposed on one major surface of said substrate;
   a current blocking layer disposed on a surface of said substrate opposite said one major surface;
   a groove of predetermined width formed transversely in said current blocking layer across an entire length thereof and having a depth extending into said substrate;
   an indent formed in said current blocking layer coextensive with said groove at a center portion of said current blocking layer, said indent having a width greater than said predetermined width;
   a first cladding layer disposed over said current blocking layer;
   an active layer disposed over said first cladding layer;
   a second cladding layer disposed over said active layer;
   a contact layer disposed over said second cladding layer; and
   a second electrode disposed over said contact layer,
   said indent forming a gain guide structure, said groove forming an index guide structure,
   wherein laser light is emitted in a multiple longitudinal mode to reduce return beam interference noise while exhibiting a stable near-field pattern.

2. A semiconductor laser comprising:
   a substrate;
   a first electrode disposed on a lower surface of said substrate;
   a current blocking layer formed on said substrate at an upper surface thereof;
   an indent formed in said current blocking layer at a center portion of the semiconductor laser having a predetermined width;
   a groove formed in said current blocking layer transversely across an entire length thereof and across said indent, said groove reaching said substrate and having a width less than said predetermined width;
   a first cladding layer formed on said current blocking layer;
   an active layer formed on said first cladding layer;
   a second cladding layer formed on said active layer;
   a contact layer formed on said second cladding layer; and
   a second electrode formed on said contact layer,
   wherein a gain guide structure is formed at the position where said indent is formed, and an index guide structure is formed where said indent is not formed.

3. The semiconductor laser of claim 2, wherein said substrate is a p-GaAs substrate, said current blocking layer is an n-GaAs current blocking layer, said first cladding layer is a p-GaAlAs cladding layer, said active layer is a GaAlAs active layer, and said second cladding layer is an n-GaAlAs cladding layer.

4. The semiconductor laser of claim 3, wherein said n-GaAs cladding layer has a thickness between 0.6 and 1.5 μm, and said indent has a depth of about 0.1 to 0.2 μm.

* * * * *